US006448854B1

United States Patent
Kimura

(10) Patent No.: US 6,448,854 B1
(45) Date of Patent: Sep. 10, 2002

(54) LINEAR TRANSCONDUCTANCE AMPLIFIER

(75) Inventor: Katsuji Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/924,625

(22) Filed: Aug. 8, 2001

(30) Foreign Application Priority Data

Aug. 11, 2000 (JP) ........................................ 2000-244935

(51) Int. Cl.$^7$ ............................................... H03F 3/45
(52) U.S. Cl. ........................................ 330/253; 330/257
(58) Field of Search ................................ 330/253, 257

(56) References Cited

U.S. PATENT DOCUMENTS

| 4,920,321 A | * | 4/1990 | Armstrong | .................. 330/257 |
| 5,515,003 A | * | 5/1996 | Kimura | ........................ 330/253 |
| 5,574,401 A | * | 11/1996 | Spitalny | ...................... 330/253 |

FOREIGN PATENT DOCUMENTS

EP          0 874 451 A2    10/1998

OTHER PUBLICATIONS

CMOS Voltage to Current Transducers (IEEE Journal of Solid–State Circuits, vol. CAS–32, No. 11, pp. 1097–1104, Nov. 1985).

* cited by examiner

Primary Examiner—Benny Lee
Assistant Examiner—Henry Choe
(74) Attorney, Agent, or Firm—Scully, Scott, Murphy & Presser

(57) ABSTRACT

A linear transconductance amplifier which is easily implemented with LSI and superior in a frequency characteristic. The linear transconductance amplifier includes N-channel MOS transistors M1, M2, M3 and M4 having their sources grounded, a current mirror circuit 1 for outputting a constant current $4I_b$, and a current mirror circuit 2 in which the ratio between the input current and the output current is 2:1. Gates of the MOS transistors M1 and M3 are connected to each other to constitute an input terminal IN1. The constant current $4I_b$ is separated into two currents, one of which is the sum $I_{SQ}^+$ of the drain currents $I_{D3}$ and $I_{D4}$ of the MOS transistors M3 and M4 and the other of which is the input current $I_{SQ}^-$ of the current mirror circuit 2. The sum of the drain current $I_{D1}$ of the MOS transistor M1 and the output current $I_{SQ}^-/2$ of the current mirror circuit 2 determine the differential output current $I^+$.

2 Claims, 8 Drawing Sheets

LINEAR TRANSCONDUCTANCE AMPLIFIER

BACKGROUND OF THE INVENTION

1. Field of the Invention

The present invention relates to a differential amplifier, and more particularly to a linear transconductance amplifier having a linear transconductance formed on a semiconductor integrated circuit.

2. Description of Related Art

Conventionally, this kind of a CMOS linear transconductance amplifier, such as a circuit shown in FIG. 7 of the publication; IEEE TRANSACTIONS ON CIRCUITS AND SYSTEMS, VOL-CAS32,NO.11, NOVEMBER 1985, PP.1097–1103, "CMOS Voltage to Current Transducers", realizes a linear operation by executing a subtraction of the drain currents of the two MOS transistors M1 and M2 having the square-law characteristic with respect to the input voltage. This scheme is well known, and an operation of the circuit having such an output circuit arrangement is referred to as a class AB operation.

Neglecting an effect depending of a substrate and an influence of channel length modulation, and assuming that the relation between the drain current and the gate-source voltage of a MOS transistor operating in a saturation region obeys the square-law, the drain current of the MOS transistor is expressed as follows:

$$I_D = \beta(V_{GS} - V_{TH})^2 \quad (V_{GS} \geq V_{TH}) \tag{1a}$$

$$I_D = 0 \quad (V_{GS} \leq V_{TH}) \tag{1b}$$

where $\beta = \mu(C_{ox}/2)(W/L)$ is a transconductance parameter, $\mu$ is an effective mobility of carrier, $C_{ox}$ is a gate oxide film capacity per unit area, W and L are a gate width and a gate length, respectively, and $V_{TH}$ is a threshold voltage.

Referring to the left of FIG. 7, there is a relationship as follows:

$$V_{in} = V_{GS1} + V_{GS2} - [V_{GS3} + V_{GS4}] \tag{2'}$$

Equation (2)' can be reduced to the following equation (2).

$$V_{in} = V_{GSeq} - (V_b + V_{THeq}) \tag{2}$$

Here, if a CMOS-pair consisting of an N-channel MOS transistor and a P-channel MOS transistor is regarded as one complex transistor, $V_{GSeq}$, $\beta_{eq}$, and $V_{THeq}$ are expressed as follows:

$$V_{GSeq} = V_{THeq} + \frac{1}{\sqrt{\beta_{eq}}}\sqrt{2I} \tag{3}$$

$$\beta_{eq} = \frac{\beta_N \beta_P}{(\sqrt{\beta_N} + \sqrt{\beta_P})^2} \tag{4}$$

$$V_{THeq} = V_{THN} + V_{THP} \tag{5}$$

In addition, $V_b$ is expressed as follows:

$$V_b = \sqrt{2I/\beta_{eq}} \tag{6}$$

From Equation (3), the following equation (7) is obtained:

$$V_{in} = \sqrt{\frac{2I_1}{\beta_{eq}}} - V_b \tag{7}$$

Referring to the left of FIG. 7, the current $I_1$ is expressed as follows:

$$I_1 = \frac{\beta_{eq}}{2}(V_b + V_{in})^2 \tag{8}$$

Similarly, referring to the right of FIG. 7, the current $I_2$ is expressed as follows:

$$I_2 = \frac{\beta_{eq}}{2}(V_b + V_{in})^2 \tag{9}$$

Consequently, the output current is expressed as follows:

$$V_{out} = I_1 - I_2 = 2\beta_{eq}V_b V_{in} = 2\sqrt{2\beta_{eq}I_b}V_{in} \tag{10}$$

FIG. 8 is a graph for explaining a linear operation. The input voltage has a linear region as follows:

$$-\sqrt{2I_b/\beta_{eq}} < V_{in} < \sqrt{2I_b/\beta_{eq}} \tag{11}$$

The output current has a linear region as follows:

$$-4I_b < I_{out} < 4I_b \tag{12}$$

Essentially, the circuit shown in FIG. 7 is a multiplier core circuit capable of implementing a multiplier circuit in itself, which is based on the following identity (13) providing a multiplying function.

$$\frac{1}{4}\{(x+y)^2 - (x+y)^2\} = xy \tag{13}$$

This technique including the value of the coefficient is referred to as "The quarter-square technique" and widely known. Accordingly, the scheme involving the subtraction of the outputs of the square-circuit is regarded as the only linearization scheme. Furthermore, the inventor considers that the scheme in which a two-quadrant multiplier is used as a linear transconductance amplifier is not sophisticated in terms of circuit arrangement, the two-quadrant multiplier being configured by fixing one input side of the multiplier core circuit with a linear transconductance capable of implementing a four-quadrant operation to restrict the same to a two-quadrant operation.

However, since the conventional CMOS linear transconductance amplifier has the P-channel MOS transistor in the signal line for subtraction of the output currents, it is difficult to improve a frequency characteristic thereof.

SUMMARY OF THE INVENTION

In analog signal processings, a differential amplifier is an essential function block. Particularly, a requirement of a MOS differential amplifier with a linear characteristic has been grown. Thus, an object of the present invention is to provide a linear transconductance amplifier which is easily implemented with LSI and superior in a frequency characteristic.

According to a first aspect of the present invention, there is provided a linear transconductance amplifier in which gates of a first and second transistors having their sources grounded are connected to each other to constitute an input terminal pair. The linear transconductance amplifier comprises means for forming an added current by adding two currents substantially equal to the drain currents of the first and second transistors, respectively, a constant current source for outputting a constant current, and means for forming a subtracted current by subtracting the addition current from the constant current. In the linear transconductance amplifier, one differential output current is formed by adding the drain current of the first transistor and a current almost a half of the subtraction current, and the other differential output current is formed by adding the drain current of the second transistor and a current almost a half of the subtraction current. Further, an input voltage applied to the input terminal pair is a differential voltage superimposed on a constant DC voltage (claim 1). Transistor described here includes a MOS (metal-oxide semiconductor) transistor, a MIS (metal insulator semiconductor) transistor, and the like.

More particularly, the first linear transconductance amplifier according to the present invention has the following configuration (claim 2). There is provided a linear transconductance amplifier comprising a first, second, third and fourth N-channel MOS transistors having their sources grounded, a constant current source for outputting a constant current, and a current mirror circuit in which a ratio between an input current and an output current is constant. In the linear transconductance amplifier, gates of the first and third MOS transistors are connected to each other to constitute one terminal of an input terminal pair, and gates of the second and fourth MOS transistors are connected to each other to constitute the other terminal of the input terminal pair. The constant current is separated into two currents, one of which is the sum of drain currents of the third and fourth MOS transistors and the other of which is an input current of the current mirror circuit. Furthermore, the sum of a drain current of the first MOS transistor and an output current of the current mirror circuit constitutes one differential output current, and the sum of a drain current of the second MOS transistor and an output current of the current mirror circuit constitutes the other differential output current.

In the second liner transconductance amplifier according to the present invention, gates of a first and second transistors having their sources grounded are connected to each other, and further connected to the drains of the first and second transistors through resistors, respectively, and gates of a third and fourth transistors having their sources grounded are connected to the drains of the first and second transistors, thereby constituting an input terminal pair. The linear transconductance amplifier comprises means for forming an added current by adding two currents substantially equal to drain currents of the third and fourth transistors, respectively, a constant current source for outputting a constant current, and means for forming a subtracted current by subtracting the addition current from the constant current. In the linear transconductance amplifier, one differential output current is formed by adding the drain current of the first transistor to a current almost a half of the subtraction current, and the other differential output current is formed by adding the drain current of the second transistor to a current almost a half of the subtraction current, and an input current applied to the input terminal pair is a differential current superimposed on a constant DC current (claim 3).

More particularly, the second linear transconductance amplifier according to the present invention has the following configuration (claim 4). The linear transconductance amplifier comprises a first, second, third, fourth, fifth and sixth N-channel MOS transistors having their sources grounded, a first and second resistors, a constant current source for outputting a constant current, and a current mirror circuit in which a ratio between an input current and an output current is constant. Gates of said third and fifth MOS transistors are connected to each other to constitute one terminal of an input terminal pair, and gates of the fourth and sixth MOS transistors are connected to each other to constitute the other terminal of the input terminal pair. Further, the first and second resistors are connected in series between one terminal of the input terminal pair and the other terminal of the input terminal pair, and a drain of the first MOS transistor is connected to one terminal of the input terminal pair and a gate of the first MOS transistor is connected to a connection point between the first and second resistors, and a drain of the second MOS transistor is connected to the other terminal of the input terminal pair and a gate of the second MOS transistor is connected to the connection point between the first and second resistors. Furthermore, the constant current is separated into two currents, one of which is the sum of drain currents of the fifth and sixth MOS transistors and the other of which is an input current of the current mirror circuit. Moreover, one differential output current is formed by the sum of a drain current of the third MOS transistor and an output current of the current mirror circuit, and the other differential output current is formed by the sum of a drain current of the fourth MOS transistor and the output current of the current mirror circuit.

The third liner transconductance amplifier according to the present invention, in which gates of a first and second transistors having their sources grounded constitute an input terminal pair, comprises means for forming an added current by adding two currents substantially equal to a half of drain currents of the first and second transistors, respectively. One differential output current is formed by subtracting the drain current of the first transistor from the addition current, and the other differential output current is formed by subtracting the drain current of the second transistor from the addition current. Further, an input voltage applied to the input terminal pair is a differential voltage superimposed on a constant DC voltage (claim 5).

More particularly, the third linear transconductance amplifier according to the present invention has the following configuration (claim 6). The linear transconductance amplifier comprises a first, second, third, fourth, fifth and sixth N-channel MOS transistors having their sources grounded, a first current mirror circuit, and first and second current mirror circuits in which a ratio between an input current and an output current is constant. In the third linear transconductance amplifier, gates of the first, third and fifth MOS transistors are connected to each other to constitute one terminal of an input terminal pair, and gates of the second, fourth and sixth MOS transistors are connected to each other to constitute the other terminal of the input terminal pair. Further, an input current of the first current mirror circuit is separated into two currents, one of which is a drain current of the third MOS transistor and the other of which is a drain current of the fourth MOS transistor, and an input current of the second current mirror circuit is separated into two currents, one of which is a drain current of the fifth MOS transistor and the other of which is a drain current of the sixth MOS transistor. Furthermore, an output current of the first current mirror circuit is separated into two currents, one of which is a drain current of the first MOS transistor and the other of which is one differential output current, and an output current of the second current mirror circuit is separated into two currents, one of which is a drain current of the second MOS transistor and the other of which is the other differential output current.

The fourth linear transconductance amplifier according to the present invention, in which gates of a first and second transistors having their sources grounded are connected to each other and further connected to drains of the first and second transistors through resistors, respectively, and gates of a third and fourth transistors having their sources grounded are connected to the drains of the first and second transistors, thereby constituting an input terminal pair, comprises means for forming an added current by adding two currents substantially equal to a half of drain currents of the third and fourth transistors, respectively. In the forth linear transconductance amplifier, one differential output current is formed by subtracting the drain current of the third transistor from the addition current, and the other differential output current is formed by subtracting the drain current of the forth transistor from the addition current. Further, an input current applied to the input terminal pair is a differential current superimposed on a constant DC current.

More particularly, the fourth linear transconductance amplifier according to the present invention has the following configuration (claim 8). The linear transconductance amplifier comprises a first, second, third, fourth, fifth, sixth, seventh and eighth N-channel MOS transistors having their sources grounded, a first and second resisters, and a first and second current mirror circuits, in which a ratio between an input current and an output current is constant. In the forth linear transconductance amplifier, gates of the third, fifth and seventh MOS transistors are connected to each other to constitute one terminal of an input terminal pair, and gates of the fourth, sixth and eighth MOS transistors are connected to each other to constitute the other terminal of the input terminal pair. Further, the first and second resistors are connected in series between one terminal of the input terminal pair and the other terminal of the input terminal pair. Furthermore, a drain of the first MOS transistor is connected to one terminal of the input terminal pair and a gate of the first MOS transistor is connected to a connection point between the first and second resistors, and a drain of the second MOS transistor is connected to the other terminal of the input terminal pair and a gate of the second MOS transistor is connected to the connection point between the first and second resistors. Moreover, an input current of the first current mirror circuit is separated into two currents, one of which is a drain current of the seventh MOS transistor and the other of which is a drain current of said eighth MOS transistor, and an input current of the second current mirror circuit is separated into two currents, one of which is a drain current of the fifth MOS transistor and the other of which is a drain current of the sixth MOS transistor. Still further, an output current of the first current mirror circuit is separated into two currents, one of which is a drain current of the third MOS transistor and the other of which is one differential output current, and an output current of the second current mirror circuit is separated into two currents, one of which is a drain current of the fourth MOS transistor and the other of which is the other differential output current.

Operations of the linear transconductance amplifier according to the present invention is as follows: the scheme for obtaining a linear characteristic from a curve with square-law characteristic, which is generally referred to as a parabolic characteristic, includes a scheme involving a way by adding a square-law characteristic to a parabolic characteristic, besides the scheme involving subtracting a parabolic characteristic from another parabolic characteristic described with regard to the conventional circuit example. If such an addition is an addition of currents, it is expected that frequency characteristic is improved in that the linear transconductance amplifier can be configured without any P-channel transistor in a signal path.

DETAILED DESCRIPTION OF THE PREFERRED EMBODIMENTS

Preferred embodiments of the present invention will be described in detail below with reference to accompanying drawings.

Figure 1:
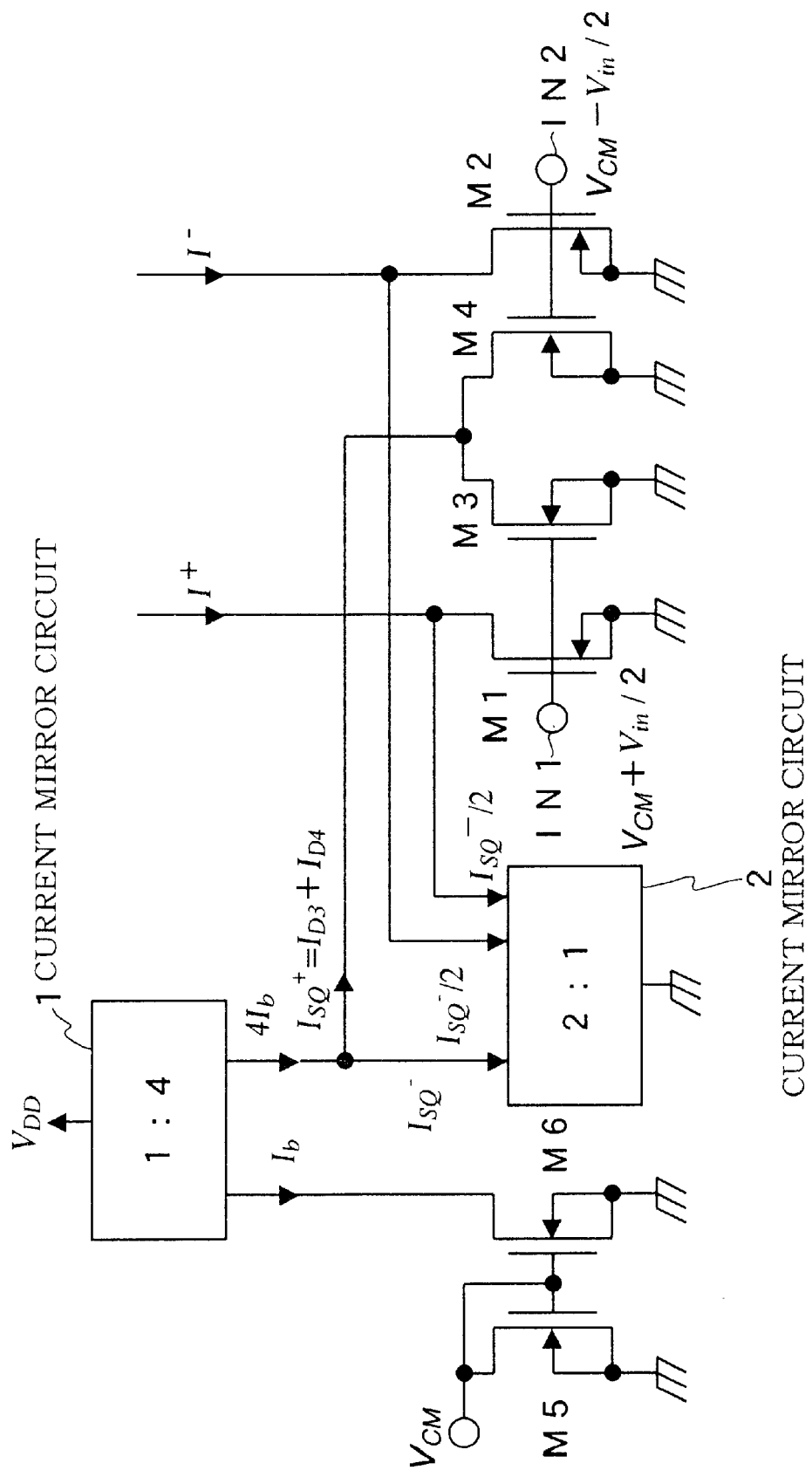
FIG. 1 is a circuit diagram illustrating a first embodiment of a linear transconductance amplifier according to the present invention.
Figure 2:
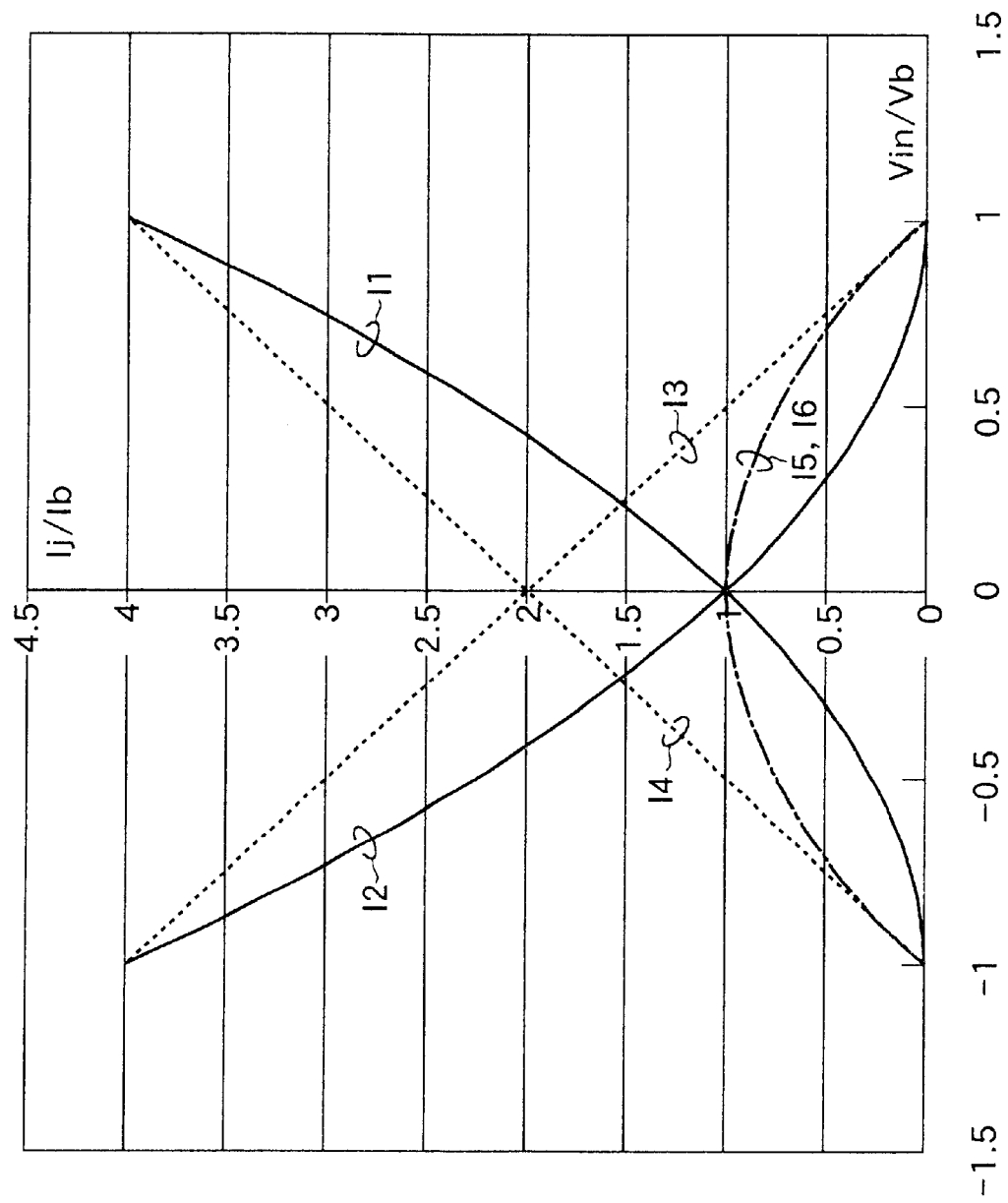
FIG. 2 is a graph for explaining a linear operation of the linear transconductance amplifier of FIGS. 1 and 3.

FIG. 1 is a circuit diagram illustrating a first embodiment of a linear transconductance amplifier according to the present invention (corresponding to claims 1and 2, to be described later). FIG. 2 is a graph for explaining linear operation of the linear transconductance amplifier of FIGS. 1 and 3. Now, description will be made with reference to these FIGS. 1 and 2.

First, description will be made referring to FIG. 2. In the drawing, increasing current $I_1$ is expressed as follows:

$$I_1 = \frac{I_b}{V_b^2}(V_b + V_{in})^2 \quad (|V_{in}| \leq V_b) \tag{14}$$

Similarly, decreasing current $I_2$ is expressed as follows:

$$I_2 = \frac{I_b}{V_b^2}(V_b + V_{in})^2 \quad (|V_{in}| \leq V_b) \tag{15}$$

Here, two straight dotted lines $I_3$ and $I_4$ are expressed as follows:

$$I_3 = 2I_b\left(1 + \frac{1}{V_b}V_{in}\right) \quad (|V_{in}| \leq V_b) \tag{16}$$

$$I_4 = 2I_b\left(1 + \frac{1}{V_b}V_{in}\right) \quad (|V_{in}| \leq V_b) \tag{17}$$

Consequently, current $I_5$ to be added to current $I_1$ to provide linear current $I_3$ is found as follows:

$$I_5 = I_3 - I_1 = I_b\left(1 - \frac{1}{V_b^2}V_{in}^2\right) \quad (|V_{in}| \leq V_b) \tag{18}$$

Similarly, current $I_6$ to be added to current $I_2$ to provide linear current $I_4$ is found as follows:

$$I_6 = I_4 - I_2 = I_b\left(1 - \frac{1}{V_b^2}V_{in}^2\right) \quad (|V_{in}| \leq V_b) \tag{19}$$

Here, it is to be noted that:

$$I_5 = I_6 \tag{20}$$

That is, both the increasing parabolic current $I_1$ and the decreasing parabolic current $I_2$ are made to be linear by addition of the two square-currents $I_5$ and $I_6$ passing through three points $(-V_b, 0)$, $(0, I_b)$, $(V_b, 0)$. Here, an input linear operation region is as follows:

$$|V_{in}| \leq V_b \tag{21}$$

Further, a linear region for the output currents is as follows:

$$0 \leq I_3, I_4 \leq 4I_b \tag{22}$$

Next, description will be made referring to FIG. 1. The linear transconductance amplifier of this embodiment comprises N-channel MOS transistors M1, M2, M3 and M4 having sources thereof grounded, a current mirror circuit 1 serving as a constant current source for outputting a constant current $4I_b$, and a current mirror circuit 2 in which ratio between an input current and an output current is 2:1. Gates of the MOS transistors M1 and M3 are connected to each other to constitute an input terminal IN1. Gates of the MOS transistors M2 and M4 are connected to each other to constitute an input terminal IN 2. The constant current $4I_b$ is separated into two currents $I_{SQ}^+$ and $I_{SQ}^-$, one of which is the sum of two drain currents $I_{D3}$ and $I_{D4}$ of the MOS transistors M3 and M4, respectively, and the other is the input current of the current mirror circuit 2. The sum of the drain current $I_{D1}$ of the MOS transistor M1 and the output current $I_{SQ}^-/2$ of the current mirror circuit 2 determine the differential output current $I^+$, while the sum of the drain current $I_{D2}$ of the MOS transistor M2 and the output current $I_{SQ}^-/2$ of the current mirror circuit 2 determine the differential output current $I^-$.

In FIG. 1, two rectangular boxes represent the current mirror circuits 1 and 2. The ratios inscribed in the boxes indicates their respective current mirror ratios. Gates of the MOS transistors M1 and M3 are connected to each other and the voltage $V_{CM}+(V_{in}/2)$ is applied thereto, and the current $I_1$ flows through the respective MOS transistors M1 and M3. Accordingly, there is provided a relationship as follows:

$$I_{D1} = I_{D3} = I_1 = \frac{I_b}{V_b^2}(V_b + V_{in})^2 \quad (|V_{in}| \leq V_b) \tag{23}$$

Similarly, gates of the MOS transistors M2 and M4 are connected to each other and the voltage $V_{CM}+(V_{in}/2)$ is applied thereto, and the current $I_2$ flows through the respective MOS transistors M2 and M4. Accordingly, there is provided a relationship as follows:

$$I_{D2} = I_{D4} = I_2 = \frac{2I_b}{V_b^2}(V_b + V_{in})^2 \quad (|V_{in}| \leq V_b) \tag{24}$$

Consequently, the MOS transistors M3 and M4 whose drains are connected to each other constitute a square-circuit which draws the positive phase square-current into it. The positive phase square-current is expressed as follows:

$$I_{SQ}^+ = I_{D3} + I_{D4} = \frac{2I_b}{V_b^2}(V_b^2 + V_{in}^2) \quad (|V_{in}| \leq V_b) \tag{25}$$

Here, there is a relationship as follows:

$$I_{SQ}^+ = I_{D3} + I_{D4} \leq 4I_b \quad (|V_{in}| \leq V_b) \tag{26}$$

Also, the MOS transistors M5 and M6 constitute a current mirror circuit. The MOS transistor M5 whose source is grounded has its gate and drain connected to each other. The DC voltage $V_{CM}$ is applied to the connection and the constant DC current $I_b$ flows through the MOS transistor M5. Also, the constant DC current $I_b$ flows through the MOS transistor M6 that constitutes the current mirror circuit. The constant DC current $I_b$ is expressed as follows:

$$I_b = \beta(V_{CM} - V_{TH})^2 \tag{27}$$

From the expressions (25) and (26), it is found that, in the linear operation region $|V_{in}| \leq V_b$, an opposite-phase square-current is outputted and supplied to the current mirror circuit 2 with a current ratio of 2:1 when the current $4I_b$ is supplied to the square-circuit through the current mirror circuit 1 with a current ratio of 1:4, the opposite-phase square-current being expressed as follows:

$$I_{SQ}^- = 4I_b - I_{SQ} = 2I_b\left(1 - \frac{1}{V_b^2}V_{in}^2\right) \quad (|V_{in}| \leq V_b) \tag{28}$$

Here, compared with the equation (18) and equation (19), it is found that the current value of the equation (28) is twice as large as those of equations (18) and (19). Consequently, the current value is halved by passing through the current mirror circuit 2 with a current ratio of 2:1, and the currents of the halved value are outputted in two lines and added to the drain currents of the MOS transistors M1 and M2, respectively, resulting in the linear currents $I_3$ and $I_4$ represented by the equations (16) and (17). Therefore, liner currents are obtained as follows:

$$I^+ = I_3 = 2I_b\left(1 + \frac{1}{V_b}V_{in}\right) \quad (|V_{in}| \leq V_b) \tag{29}$$

-continued $$I^- = I_4 = 2I_b\left(1 + \frac{1}{V_b}V_{\text{in}}\right) \quad (|V_{\text{in}}| \leq V_b) \tag{30}$$

Thus, the linear transconductance amplifier can be realized. An operation of the circuit having such an output circuit arrangement is referred to as a class A operation. Further, an OTA (operational transconductance amplifier) can be realized when driving the MOS transistors M1 and M2 with a constant-current source $2I_b$.

Furthermore, since a constant current flows the current mirror circuit 1 while any signal current does not flow the current mirror circuit 1, a frequency characteristic is not significantly degraded even if the current mirror circuit 1 is composed of the P-channel MOS transistors. On the other hand, since the signal current flows the current mirror circuit 2, a degradation of the frequency characteristic can be suppressed when the current mirror circuit 2 is composed of N-channel MOS transistors.

Furthermore, the current ratios of the respective current mirror circuits 1, 2 shown in FIG. 2 can be changed freely by changing the gate ratios (W/L) of the MOS transistors M1 to M6 in the circuit. For instance, when the MOS transistors M3 and M4 are regarded as a unit transistor and the gate ratios (W/L) of the MOS transistors M1, M2, M5, and M6 are set to be twice as large as the gate ratio of the unit transistor, the current ratio of both the current mirror circuits 1 and 2 becomes 1:1.

Figure 3:
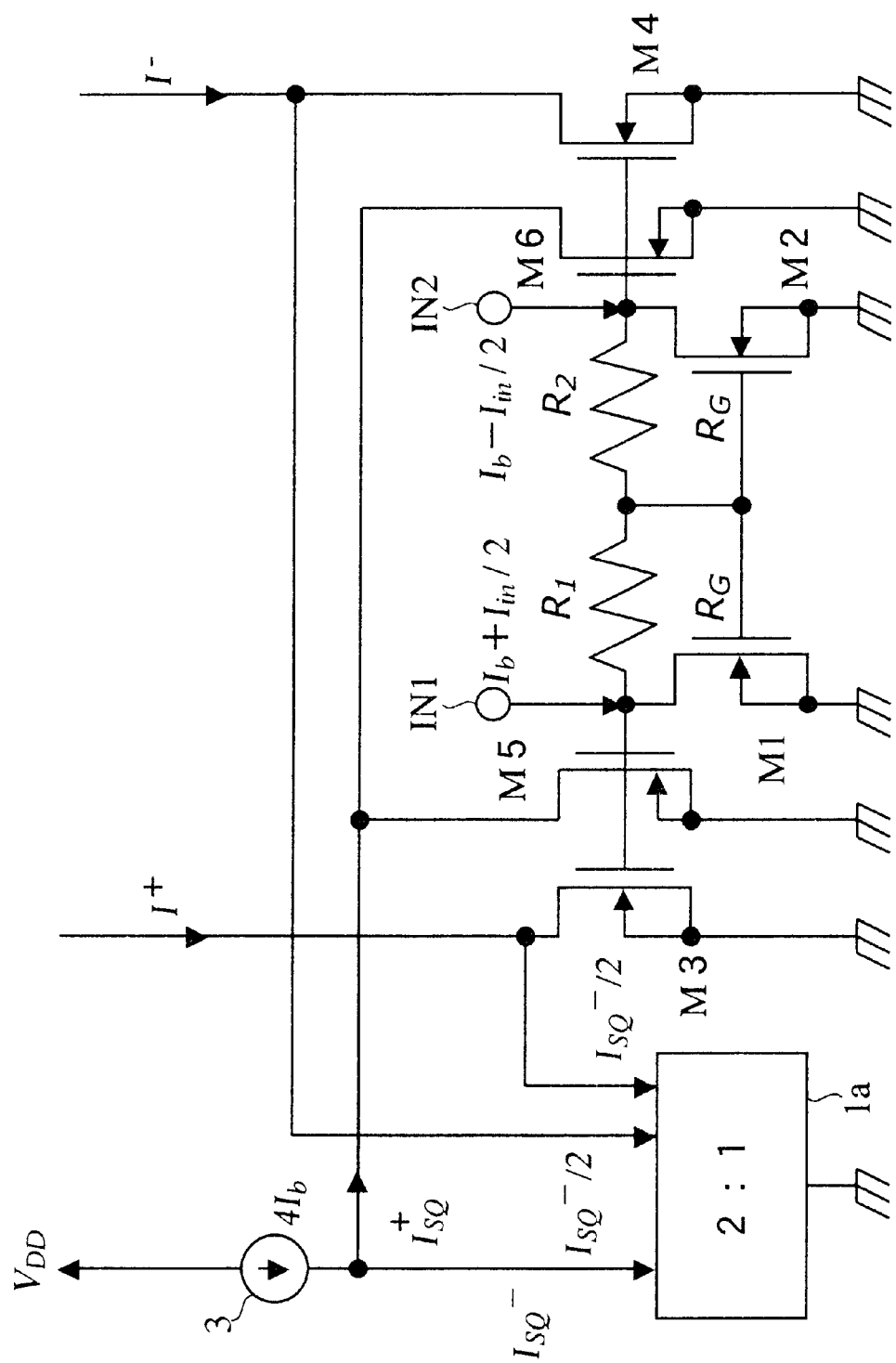
FIG. 3 is a circuit diagram illustrating a second embodiment of the linear transconductance amplifier according to the present invention.

FIG. 3 is a circuit diagram illustrating a second embodiment of the linear transconductance amplifier according to the present invention (corresponding to claims 3 and 4 that are described later).

Now, the second embodiment of the liner transconductance amplifier will be described with reference to FIG. 3.

While a voltage is regarded as the input signal in the first embodiment, a current is regarded as the input signal in this embodiment. In many cases, general analog circuits output currents, and particularly in differential circuits, a differential current is outputted. Consequently, a current mode will be considered in this embodiment.

The linear transconductance amplifier of this embodiment comprises N-channel MOS transistors M1, M2, M3, M4, M5 and M6 having sources thereof grounded, resistors R1 and R2, a constant-current source 3 for outputting the constant current $4I_b$, and a current mirror circuit 1a in which the ratio of the input current and the output current is 2:1. The gates of the MOS transistor M3 and the MOS transistor M5 are connected to each other to constitute an input terminal IN1, and the gates of the MOS transistor M4 and the MOS transistor M6 are connected to each other to constitute an input terminal IN2. The resistors R1 and R2 are connected in series between the input terminal IN1 and the input terminal IN2. The drain of the MOS transistor M1 is connected to the input terminal IN1, and the gate thereof is connected to the connection point between the resistor R1 and the resistor R2. The drain of the MOS transistor M2 is connected to the input terminal IN2, and the gate thereof is connected to connection point between the resistor R1 and the resistor R2. The constant current $4I_b$ is separated into two currents $I_{SQ}^+$ and $I_{SQ}^-$, one of which is the sum of the drain currents $I_{D5}$ and $I_{D6}$ of the MOS transistors M5 and M6, and the other is the input current of the current mirror circuit 1a. The sum of the drain current $I_{D3}$ of the MOS transistor M3 and the output current $I_{SQ}^-/2$ of the current mirror circuit 1a determine the differential output current $I^+$, and the sum of the drain current $I_{D4}$ of the MOS transistor M4 and the output current $I_{SQ}^-/2$ of the current mirror circuit 1a determine the differential output current $I^-$.

The gates of the MOS transistors M1 and M2 having their sources grounded are connected to each other, and then connected to their respective drains via the two resistors R1 and R2, respectively, thereby providing a differential input pair.

Assuming that the differential input currents are $I_b+(I_{in}/2)$, $I_b-(I_{in}/2)$, the drain current $I_{D1}$ is equal to the drain current $I_{D2}$ to become a constant DC current $I_b$ because the gates of the MOS transistors M1 and M2 are connected to each other, and the voltages between the gate and the source of both the MOS transistors M1 and M2 are equal to each other. This can be expressed as follows:

$$I_{D1}I_{D2}=I_b=\beta(V_{GS}-V_{TH})^2 \tag{31}$$

Further, since any current does not flow through the gates of the MOS transistors M3, M5 and the MOS transistors M4, M6 that are connected to this input pair, the input current $I_{in}/2$ flows through the two resistors R1 and R2. Furthermore, the gates of the MOS transistors M3 and M4 having their sources grounded are connected to the drains of the MOS transistors M1 and M2, respectively. Similarly, the gates of the MOS transistors M5 and M6 having their sources grounded are connected to the drains of the MOS transistors M1 and M2, respectively. The drains of the MOS transistors M5 and M6 are connected to each other.

Consequently, the current $I_{D3}$ is equal to the current $I_{D5}$ and the current $I_{D4}$ is equal to the current $I_{D6}$, then the respective currents are expressed as follows:

$$I_{D3} = I_{D5} = \beta\left(V_{GS} + \frac{R_G I_{\text{in}}}{2} - V_{TH}\right)^2 = \tag{32}$$

$$\left(\sqrt{I_b} + \frac{\sqrt{\beta}R_G}{2}I_{\text{in}}\right)^2 \left(|I_{\text{in}}| \leq \frac{2}{R_G}\sqrt{\frac{I_b}{\beta}}\right)$$

$$I_{D4} = I_{D6} = \beta\left(V_{GS} + \frac{R_G I_{\text{in}}}{2} - V_{TH}\right)^2 = \tag{33}$$

$$\left(\sqrt{I_b} + \frac{\sqrt{\beta}R_G}{2}I_{\text{in}}\right)^2 \left(|I_{\text{in}}| \leq \frac{2}{R_G}\sqrt{\frac{I_b}{\beta}}\right)$$

Consequently, the MOS transistors M5 and M6 having their drains connected to each other constitute a square-circuit which draws positive-phase square-current into it. The positive-phase square-current is expressed as follows:

$$I_{SQ}^+ = I_{D5} + I_{D6} = 2I_b + \frac{\beta R_G^2}{2}I_{\text{in}}^2 \quad \left(|I_{\text{in}}| \leq \frac{2}{R_G}\sqrt{\frac{I_b}{\beta}}\right) \tag{34}$$

Here, there is a relationship as follows:

$$I_{SQ}^+ = I_{D5} + I_{D6} \leq 4I_b \quad \left(|I_{\text{in}}| \leq \frac{2}{R_G}\sqrt{\frac{I_b}{\beta}}\right) \tag{35}$$

From the expressions (34) and (35), in the linear operation region represented by:

$$|I_{\text{in}}| \leq \frac{2}{R_G}\sqrt{\frac{I_b}{\beta}}$$

, an opposite-phase square-current is outputted and supplied to the current mirror circuit 1a with a current ratio of 2:1 when the current $4I_b$ is supplied to the square-circuit, the opposite-phase square-current being expressed as follows:

$$I_{SQ}^- = 4I_b - (I_{D5} + I_{D6}) = 2I_b - \frac{\beta R_G^2}{2} I_{in}^2 \quad \left(|I_{in}| \leq \frac{2}{R_G}\sqrt{\frac{I_b}{\beta}}\right) \quad (36)$$

Consequently, the sum currents of this output current and the drain currents of the MOS transistors M3 and M4 are obtained as follows:

$$I^+ = I_{D3} + \frac{I_{SQ}^-}{2} = 2I_b + \sqrt{\beta I_b}\, R_G I_{in} \quad \left(|I_{in}| \leq \frac{2}{R_G}\sqrt{\frac{I_b}{\beta}}\right) \quad (37)$$

$$I^- = I_{D4} + \frac{I_{SQ}^-}{2} = 2I_b - \sqrt{\beta I_b}\, R_G I_{in} \quad \left(|I_{in}| \leq \frac{2}{R_G}\sqrt{\frac{I_b}{\beta}}\right) \quad (38)$$

Thus, the linear transconductance amplifier can be realized. Further, an OTA (operational transconductance amplifier) can be realized by driving the MOS transistors M3 and M4 with the constant-current source $2I_b$. The linear transconductance amplifier thus provided is based on the assumption that the differential input currents $I_b+(I_{in}/2)$, $I_b-(I_{in}/2)$ are inputted originally. Here, it is to be considered that it is the linear transconductance amplifier such as one described in the first embodiment that can output such differential input currents $I_b+(I_{in}/2)$, $I_b-(I_{in}/2)$. Consequently, it may seem that the current-mode linear transconductance amplifier described above is unnecessary if the voltage-mode linear transconductance amplifier such as one described in the first embodiment can be realized.

Referring to the equations (33) and (34), however, it is shown that a linear transconductance can be varied by varying the resistance value $R_G$ or the current value $I_b$, the linear transconductance being expressed as follows:

$$\pm\sqrt{\beta I_b} R_G$$

In case of the linear transconductance amplifier of the type of that provides the linear transconductance depending on a source resistor in a floating state in the differential pair, the transconductance can be varied only by varying the source resistor. However, by combining it with the linear transconductance amplifier of this embodiment, the transconductance can be varied by varying the drive current even in the linear transconductance amplifier of the type that provides the linear transconductance depending on the source resistor in the floating state.

Furthermore, since any signal current does not flow in the constant current $4I_b$, the frequency characteristic is not significantly degraded even if the constant current source 3 is composed of the P-channel MOS transistor. On the other hand, since the signal current flows the current mirror circuit 1a, it is possible to suppress a degradation of the frequency characteristic when the current mirror circuit 1a is composed of N-channel MOS transistors. Furthermore, the current ratio of the current mirror circuits la shown in FIG. 3 can be changed freely by changing the gate ratios (W/L) of the MOS transistors M1 to M6 in the circuit. For instance, if the MOS transistors M3 and M4 are regarded as a unit transistor, and the gate ratios (W/L) of the MOS transistors M1, M2, M5, and M6 are set to be twice as large as the gate ratio of the unit transistor, the current ratio of the current mirror circuit becomes 1:1.

Figure 4:
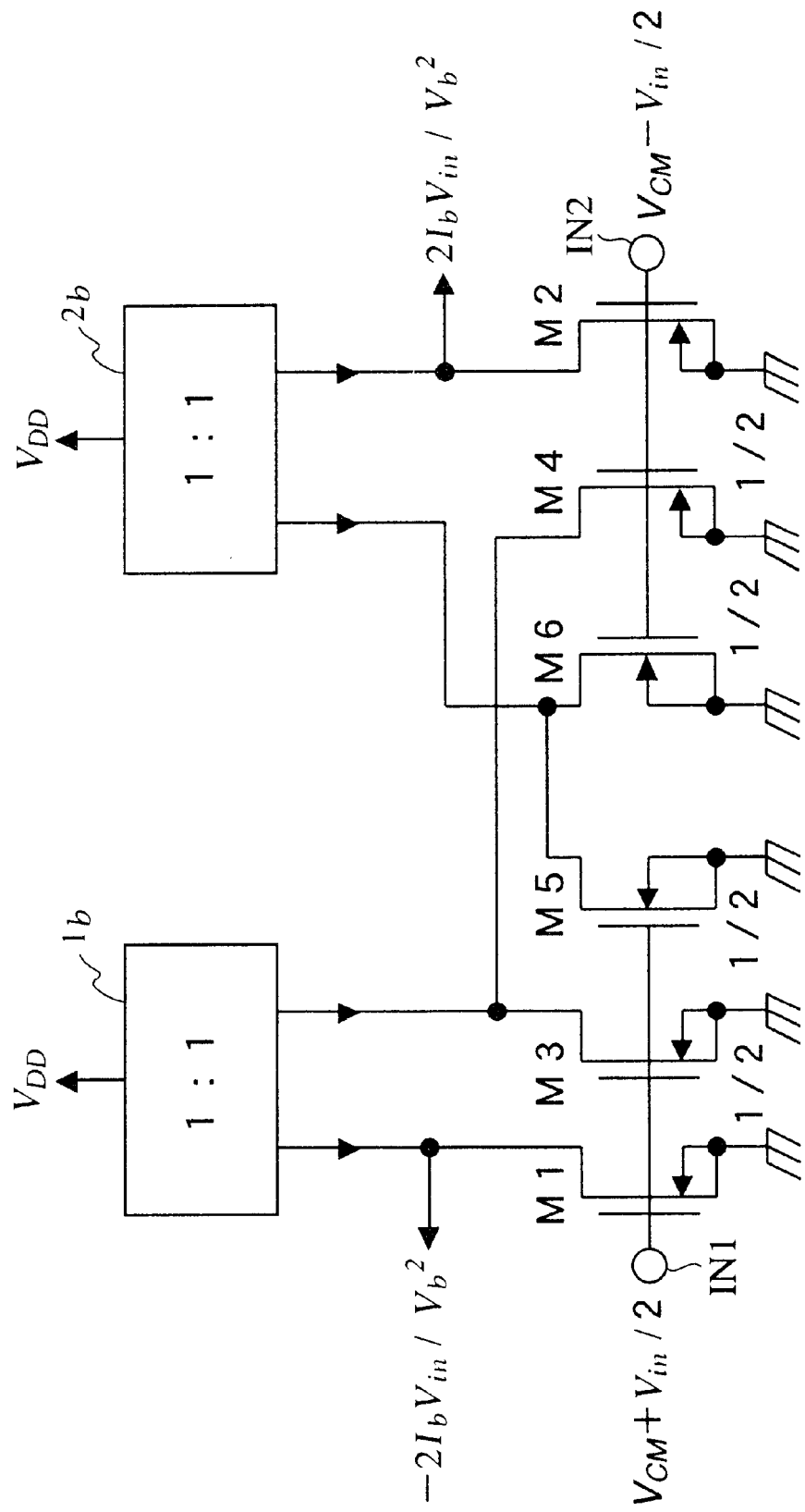
FIG. 4 is a circuit diagram illustrating a third embodiment of the linear transconductance amplifier according to the present invention.
Figure 5:
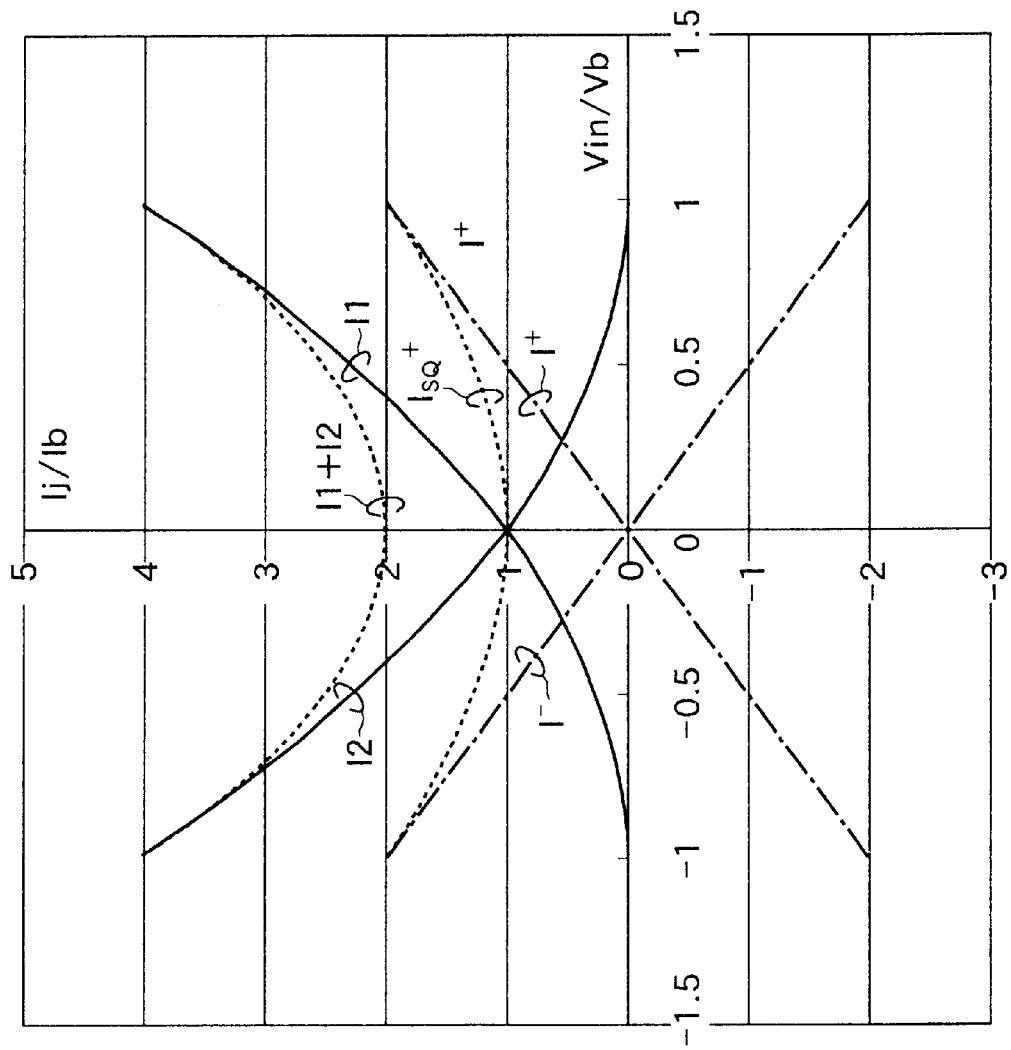
FIG. 5 is a graph for explaining a linear operation of the transconductance amplifier of FIGS. 4 and 6.

FIG. 4 is a circuit diagram illustrating a third embodiment of a linear transconductance amplifier according to the present invention (corresponding to claims 5, and 6, to be described later). FIG. 5 is a graph for explaining the linear operation of the linear transconductance amplifier of FIGS. 4 and 6. Now, description of the third embodiment will be made referring to these FIGS. 4 to 6.

First, description will be made referring to FIG. 5. The increasing current $I_1$ is expressed as follows:

$$I_1 = \frac{I_b}{V_b^2}(V_b + V_{in})^2 \quad (|V_{in}| \leq V_b) \quad (39)$$

Similarly, the decreasing current $I_2$ is expressed as follows:

$$I_2 = \frac{I_b}{V_b^2}(V_b - V_{in})^2 \quad (|V_{in}| \leq V_b) \quad (40)$$

Here, two currents $I_1$ and $I_2$ are added, and the resultant $I_1+I_2$ has the square-law characteristic and is expressed as follows:

$$I_1 + I_2 = 2I_b\left(1 + \frac{V_{in}^2}{V_b^2}\right) \quad (|V_{in}| \leq V_b) \quad (41)$$

The sum current $I_1+I_2$ is halved, and then the current $I_1$ is subtracted therefrom, resulting in a linear current proportional to the input voltage expressed as follows:

$$\frac{1}{2}(I_1 + I_2) - I_1 = -\frac{1}{2}(I_1 - I_2) = -2\frac{I_b}{V_b}V_{in} \quad (|V_{in}| \leq V_b) \quad (42)$$

Similarly, the sum current $I_1+I_2$ is halved, and then the current $I_2$ is subtracted therefrom, resulting in a linear current proportional to the input voltage expressed as follows:

$$\frac{1}{2}(I_1 + I_2) - I_2 = -\frac{1}{2}(I_1 - I_2) = -2\frac{I_b}{V_b}V_{in} \quad (|V_{in}| \leq V_b) \quad (43)$$

Next, description will be made referring to FIG. 4. The linear transconductance amplifier of this embodiment comprises N-channel MOS transistors M1, M2, M3, M4, M5 and M6 having their sources grounded, and current mirror circuits 1b and 2b in which the ratio between the input current and the output current is 1:1. The gates of the MOS transistors M1, M3 and M5 are connected to each other to constitute an input terminal IN1. The gates of the MOS transistors M2, M4 and M6 are connected to each other to constitute an input terminal IN2. The input current $I_{SQ}^+$ of the current mirror circuit 1b is separated into two currents, one of which is the drain current $I_{D3}$ of the MOS transistor M3 and the other is the drain current $I_{D4}$ of the MOS transistor M4. The input current $I_{SQ}^+$ of the current mirror circuit 2b is separated into two currents, one of which is the drain current $I_{D5}$ of the MOS transistor M5 and the other is the drain current $I_{D6}$ of the MOS transistor M6. The output current $I_{SQ}^+$ of the current mirror circuit 1b is separated into two currents, one of which is the drain current $I_{D1}$ of the MOS transistor M1 and the other is the differential output current $I^-$. The output current $I_{SQ}^+$ of the current mirror circuit 2b is separated into two currents, one of which is the drain current $I_{D2}$ of the MOS transistor M2 and the other is the differential output current $I^+$.

In FIG. 4, two rectangular boxes represent the current mirror circuits 1b, and 2b. The ratios inscribed in the boxes indicates their respective current mirror ratios. The gates of the MOS transistors M1, M3 and M5 are connected to each other and the voltage $V_{CM}+(V_{in}/2)$ is applied thereto, and the current $I_1$ flows through the MOS transistors M1, and the current ($\frac{1}{2}$)$I_1$ flows through the MOS transistors M2, M3. There is provided a relationship as follows:

$$I_{D1} = I_1 = \frac{I_b}{V_b^2}(V_b + V_{in})^2 \quad (|V_{in}| \leq V_b) \tag{44}$$

Similarly, the gates of the MOS transistors M2, M4 and M6 are connected to each other and the voltage $V_{CM}-(V_{in}/2)$ is applied thereto, and the current $I_2$ flows through the MOS transistors M2, and the current ($\frac{1}{2}$)$I_2$ flows through the MOS transistors M4, M5. There is provided a relationship as follows:

$$I_{D2} = I_2 = \frac{I_b}{V_b^2}(V_b - V_{in})^2 \quad (|V_{in}| \leq V_b) \tag{45}$$

Consequently, the MOS transistors M3 and M4 having their drains connected to each other constitute a square-circuit. The MOS transistors M5 and M6 having their drains connected to each other constitute a square-circuit. The respective square-circuits draw the positive-phase square-circuit into them, the positive-phase square-circuit being expressed as follows:

$$I_{SQ}^+ = I_{D3} + I_{D4} = I_{D5} + I_{D6} = \frac{I_b}{V_b^2}(V_b^2 + V_{in}^2) \quad (|V_{in}| \leq V_b) \tag{46}$$

Accordingly, subtractions of $I_{D1}$ and $I_{D2}$ from $I_{SQ}^+$ are carried out in the current mirror circuits $1b$, $2b$ with a current ratio of 1:1, respectively, resulting in the following equations:

$$I^+ = I_{SQ}^+ - I_2 = 2\frac{I_b}{V_b}V_{in} \quad (|V_{in}| \leq V_b) \tag{47}$$

$$I^+ = I_{SQ}^+ - I_1 = -2\frac{I_b}{V_b}V_{in} \quad (|V_{in}| \leq V_b) \tag{48}$$

Thus, a linear transconductance amplifier can be realized. The operation of the circuit having such an output circuit arrangement is referred to as a class AB operation, and an OTA (operational transconductance amplifier) can be realized as it is. Furthermore, since a signal current flows through the current mirror circuits $1b$ and $2b$, the frequency characteristic is slightly degraded when the current mirror circuits $1b$ and $2b$ are composed of the P-channel MOS transistors.

Figure 6:
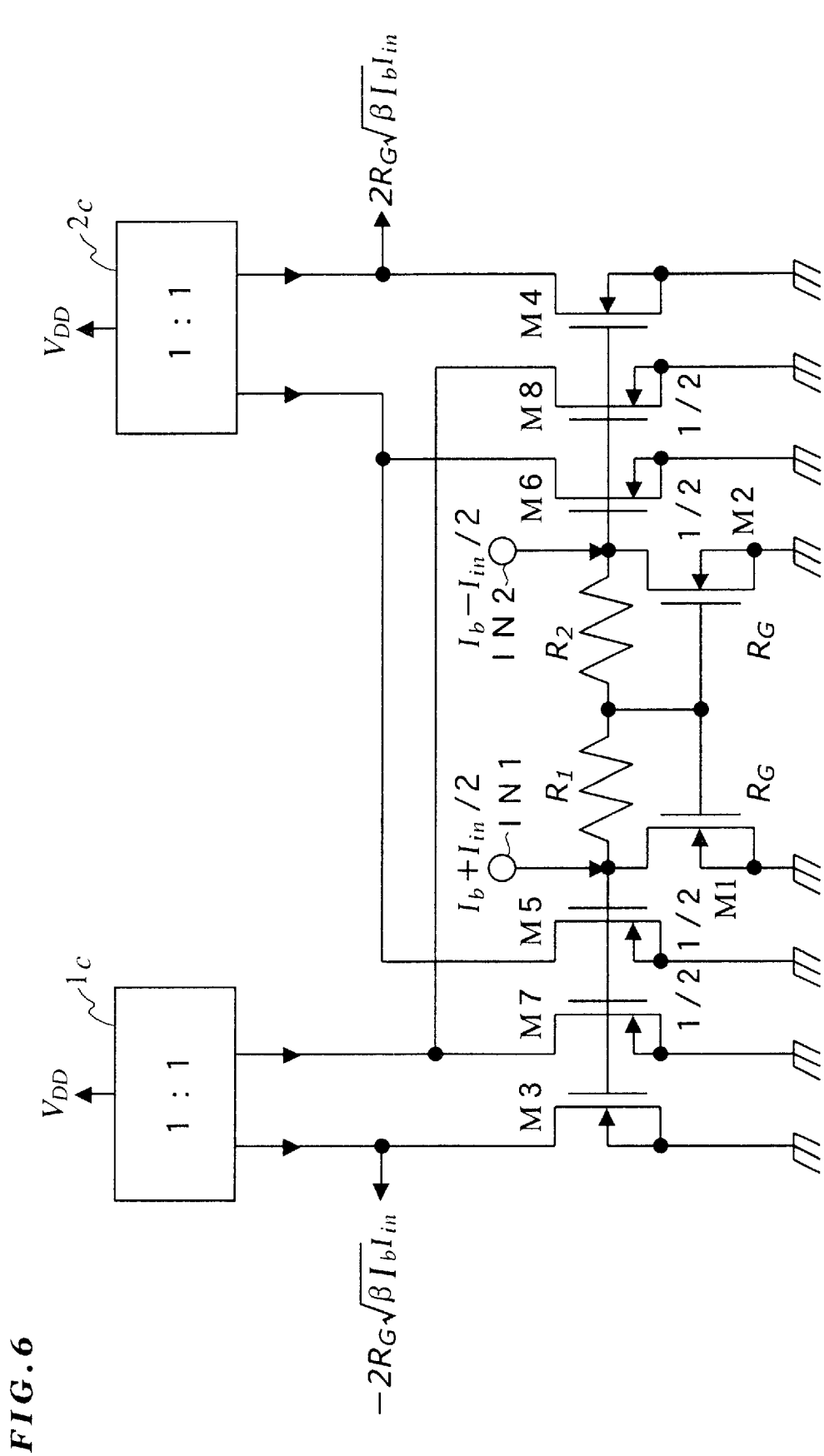
FIG. 6 is a circuit diagram illustrating a fourth embodiment of the linear transconductance amplifier according to the present invention.
Figure 7:
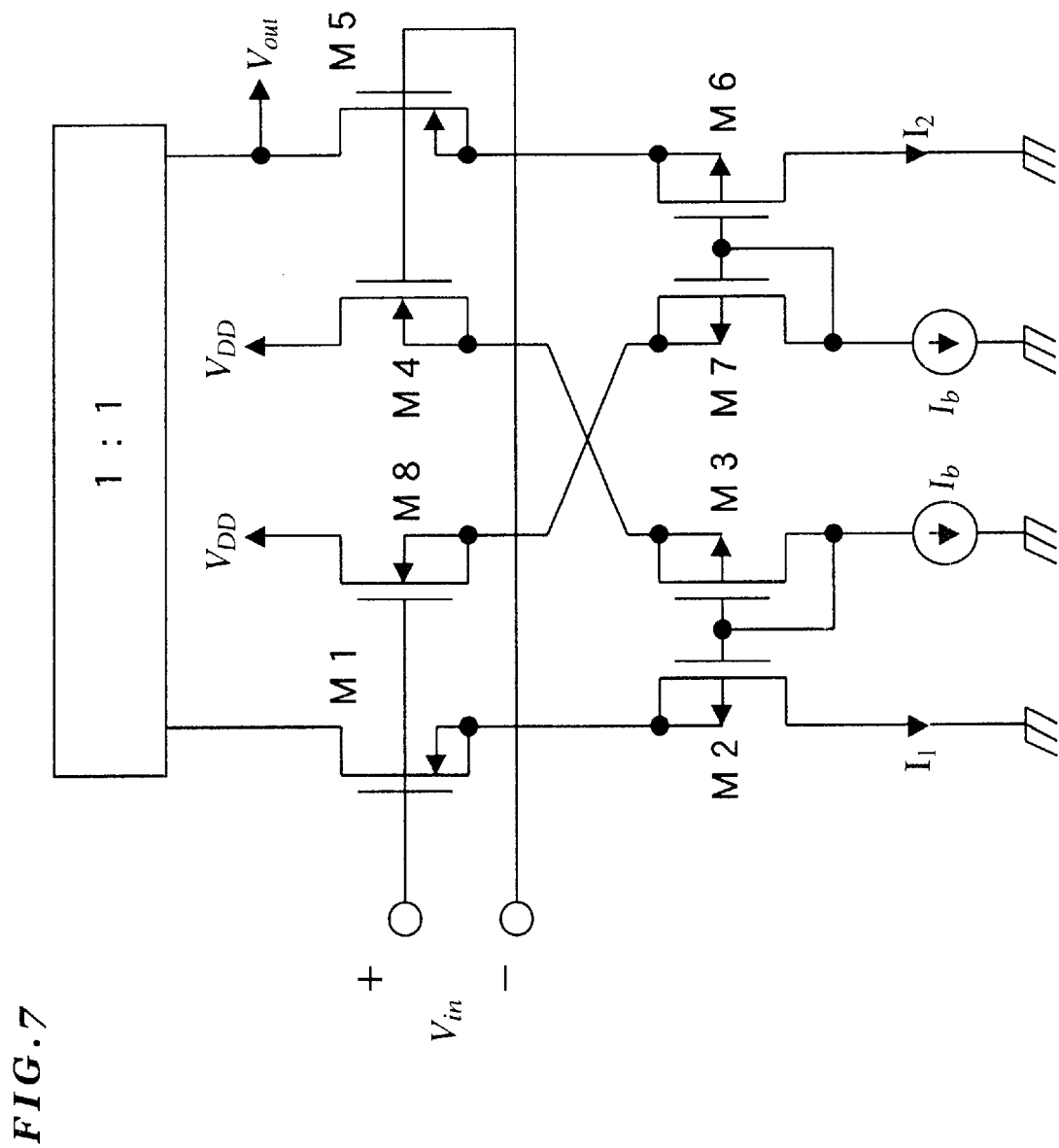
FIG. 7 is a circuit diagram illustrating the conventional transconductance amplifier.
Figure 8:
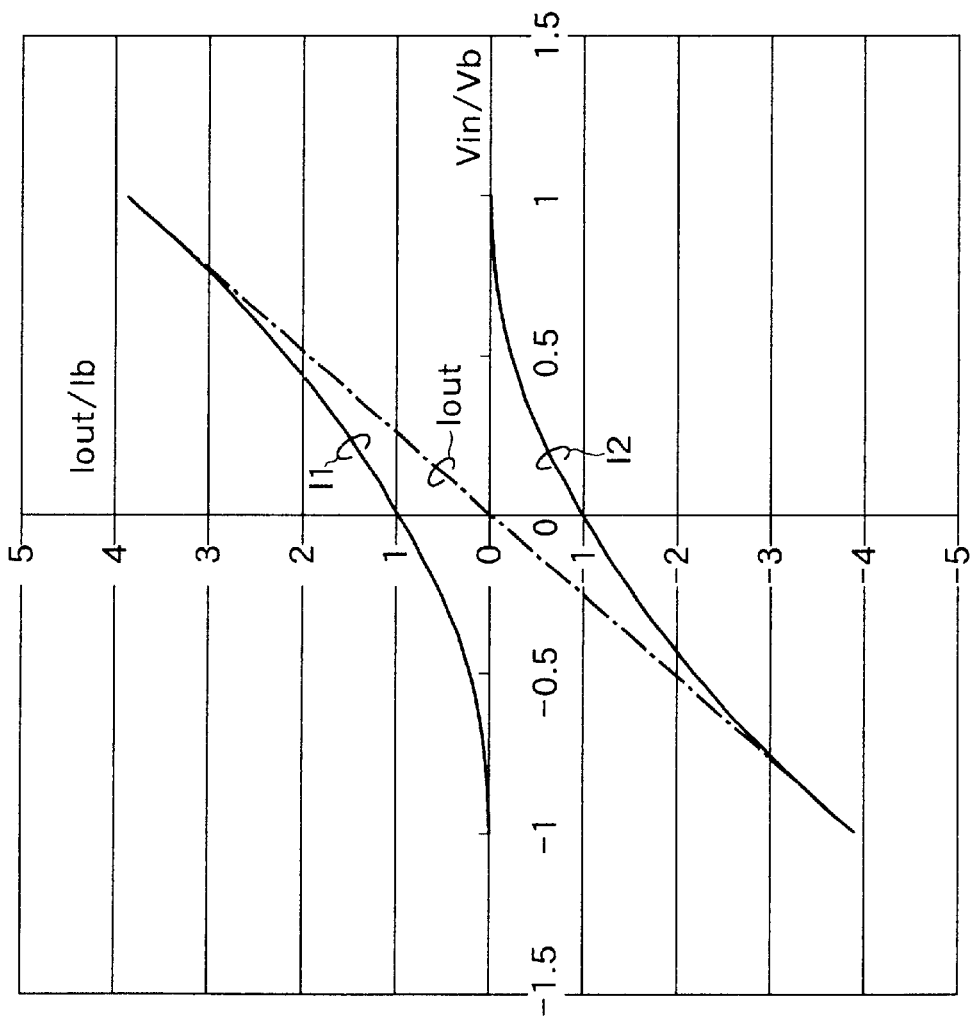
FIG. 8 is a graph for explaining a linear operation of the linear transconductance amplifier of FIG. 7.

FIG. 6 is a circuit diagram illustrating a fourth embodiment of the linear transconductance amplifier according to the present invention (corresponding to claims 7 and 8 that will be described later). Now, description will be made referring to FIG. 6.

While a voltage is regarded as the input signal in the third embodiment, a current is regarded as the input signal in this embodiment. In many cases, general analog circuits output currents, and particular, in most differential circuits, a differential current is outputted. Consequently, a current-mode will be considered in this embodiment.

The linear transconductance amplifier of this embodiment comprises N-channel MOS transistors M1, M2, M3, M4, M5, M6, M7 and M8 having their sources grounded, resistors R1 and R2, and current mirror circuits $1c$ and $2c$ in which the ratio between the input current and the output current is 1:1. Gates of the MOS transistors M3, M5 and M7 are connected to each other to constitute an input terminal IN1, and the gates of the MOS transistors M4, M6 and M8 are connected to each other to constitute an input terminal IN2. The resistors R1 and R2 are connected in series between the input terminal IN1 and the input terminal IN2. The drain of the MOS transistor M1 is connected to the input terminal IN1, and the gate thereof is connected to the connection point between the resistor R1 and the resistor R2. The drain of the MOS transistor M2 is connected to the input terminal IN2, and the gate thereof is connected to the connection point between the resistor R1 and the resistor R2. The input current $I_{SQ}^+$ of the current mirror circuit $1c$ is separated into two currents, one of which is the drain current $I_{D7}$ of the MOS transistor M7 and the other is the drain current $I_{D8}$ of the MOS transistor M8. The input current $I_{SQ}^+$ of the current mirror circuit $2c$ is separated into two currents, one of which is the drain current $I_{D5}$ of the MOS transistor M5 and the other is the drain current $I_{D6}$ of the MOS transistor M6. The output current $I_{SQ}^+$ of the current mirror circuit $1b$ is separated into two currents, one of which is the drain current $I_{D3}$ of the MOS transistor M3 and the other is the differential output current $I^-$. The output current $I_{SQ}^+$ of the current mirror circuit $2c$ is separated into two currents, one of which is the drain current $I_{D4}$ of the MOS transistor M4 and the other is the differential output current $I^+$.

In FIG. 6, the gates of the MOS transistors M1 and M2 having their sources grounded are connected to each other, and then connected to their respective drains via the two resistors R1 and R2, respectively, thereby providing a differential input pair.

Assuming that the differential input currents are $I_b+(I_{in}/2)$, $I_b-(I_{in}/2)$, the drain current $I_{D1}$ is equal to the drain current $I_{D2}$ to become the constant DC current $I_b$ because the gates of the MOS transistors M1 and M2 are connected to each other, and the voltages between the gate and the source of both the MOS transistors M1 and M2 are equal to each other. This can be expressed as follows:

$$I_{D1}=I_{D2}=I_b=\beta(V_{GS}-V_{TH})^2 \tag{49}$$

Further, since any current does not flow through the respective gates of the MOS transistors M3, M5 and M7 and the MOS transistors M4, M6 and M8 that are connected to this input pair, it follows that the input current ($I_{in}/2$) flows through the two resistors R1 and R2. Furthermore, the gates of the MOS transistors M3 and M4 having their sources grounded are connected to the drains of the MOS transistors M1 and M2, respectively. Similarly, the gates of the MOS transistors M5 and M7 having their sources grounded are connected to the drain of the MOS transistor M1. The gates of the MOS transistors M6 and M8 having their sources grounded are connected to the drain of the MOS transistor M2. Accordingly, there is provided relationships as follows:

$$I_{D3} = \beta\left(V_{GS} + \frac{R_G I_{in}}{2} - V_{TH}\right)^2 \tag{50}$$

$$= \left(\sqrt{I_b} + \frac{\sqrt{\beta} R_G}{2} I_{in}\right)^2$$

$$\left(|I_{in}| \leq \frac{2}{R_G}\sqrt{\frac{I_b}{\beta}}\right)$$

-continued $$I_{D5} = I_{D7} = \frac{1}{2}\beta\left(V_{GS} + \frac{R_G I_{in}}{2} - V_{TH}\right)^2 \quad (51)$$

$$= \frac{1}{2}\left(\sqrt{I_b} + \frac{\sqrt{\beta} R_G}{2} I_{in}\right)^2$$

$$\left(|I_{in}| \leq \frac{2}{R_G}\sqrt{\frac{I_b}{\beta}}\right)$$

$$I_{D4} = \beta\left(V_{GS} - \frac{R_G I_{in}}{2} - V_{TH}\right)^2 \quad (52)$$

$$= \left(\sqrt{I_b} + \frac{\sqrt{\beta} R_G}{2} I_{in}\right)^2$$

$$\left(|I_{in}| \leq \frac{2}{R_G}\sqrt{\frac{I_b}{\beta}}\right)$$

$$I_{D6} = I_{D8} = \frac{1}{2}\beta\left(V_{GS} - \frac{R_G I_{in}}{2} - V_{TH}\right)^2 \quad (53)$$

$$= \frac{1}{2}\left(\sqrt{I_b} + \frac{\sqrt{\beta} R_G}{2} I_{in}\right)^2$$

$$\left(|I_{in}| \leq \frac{2}{R_G}\sqrt{\frac{I_b}{\beta}}\right)$$

Consequently, the MOS transistors M5 and M6 having their drains connected each other constitute a square-circuit which draws the positive-phase square-current into it. The positive-phase square-current is expressed as follows:

$$I_{SQ}^+ = I_{D5} + I_{D6} = I_{D7} + I_{D8} \quad (54)$$

$$= I_b + (\beta R_G^2/4)I_{in}^2$$

$$\left(|I_{in}| \leq \frac{2}{R_G}\sqrt{\frac{I_b}{\beta}}\right)$$

Accordingly, subtractions of $I_{D3}$ and $I_{D4}$ from $I_{SQ}^+$ are carried out in the current mirror circuits 1c and 2c with a current ratio of 1:1, respectively, resulting in the following equations:

$$I^+ = I_{SQ}^+ - I_{D4} = 2R_G\sqrt{\beta I_b}\, I_{in}\left(|I_{in}| \leq \frac{2}{R_G}\sqrt{\frac{I_b}{\beta}}\right) \quad (55)$$

$$I^- = I_{SQ}^+ - I_{D3} = -2R_G\sqrt{\beta I_b}\, I_{in}\left(|I_{in}| \leq \frac{2}{R_G}\sqrt{\frac{I_b}{\beta}}\right) \quad (56)$$

Thus, a linear transconductance amplifier proportional to the input current can be realized. Further, an OTA (operational transconductance amplifier) can be realized as it is.

The linear transconductance amplifier thus provided is based on the assumption that the differential input currents $I_b+(I_{in}/2)$, $I_b-(I_{in}/2)$ are inputted originally. Here, it is to be considered that it is the linear transconductance amplifier such as one described in the first and third embodiments that can output such differential input currents $I_b+(I_{in}/2)$, $I_b-(I_{in}/2)$. Consequently, it may seem that the current-mode linear transconductance amplifier described above is unnecessary if the voltage-mode linear transconductance amplifier such as one described in the first and third embodiments can be realized.

Referring to the equations (55) and (56), however, it is shown that a linear transconductance can be varied by varying the resistance value $R_G$ or the current value $I_b$, the linear transconductance being expressed as follows:

$$\pm\sqrt{\beta I_b} R_G$$

In the case of the linear transconductance amplifier of the type that provides the linear transconductance depending on the source resistor in the floating state in the differential pair, the transconductance can be varied only by varying the source resistor. However, by combining it with the linear transconductance amplifier of this embodiment, the transconductance can be varied by varying the drive current even in the linear transconductance amplifier of the type that provides the linear transconductance depending on the source resistor in the floating state, since the signal current flows through the current mirror circuits 1c and 2c, the frequency characteristic is slightly degraded when the linear transconductance amplifier is constituted by the P-channel MOS transistor.

The linear transconductance amplifier according to the present invention provides the following advantages. The first advantage is that a linear current can be obtained by addition of the output currents. This allows the output circuit to be realized with only N-channel transistors without P-channel transistors, thereby improving a frequency characteristic. This is because, regardless of whether the transistor has an increasing or decreasing parabolic characteristic curve, a straight line can be obtained by adding a square curve of a convex shape to the characteristic curve. A second advantage is that a linear current can be obtained by subtraction of the output current. This allows a CMOS OTA (CMOS operational transconductance amplifier) to be realized. This is because, regardless of whether the transistor has an increasing or decreasing parabolic characteristic curve, a straight line can be obtained by subtracting a square curve of a convex shape from the characteristic curve.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims as therefore intended to be embraced therein.

The entire disclosure of Japanese Patent Application No. 2000-244935 (Filed on Aug. 11, 2000) including specification, claims, drawings and summary are incorporated herein by reference in its entirety.

What is claimed is:

1. A linear transconductance amplifier, comprising:
   a first transistor and a second transistor each having grounded source, the gates of the transistors constituting an input terminal pair;
   means for forming an addition current by adding currents substantially equal to drain currents of said first transistor and said second transistor;
   a constant current source for outputting a constant current; and
   means for forming a subtraction current by subtracting said addition current from said constant current,
   wherein one differential output current is formed by adding the drain current of said first transistor to a current almost a half of said subtraction current, and the other differential output current is formed by adding the drain current of said second transistor to a current almost a half of said subtraction current, and an input voltage applied to said input terminal pair is a differential voltage superimposed on a constant DC current voltage.

2. A linear transconductance amplifier, comprising:

a first N-channel MOS transistor, a second N-channel MOS transistor, a third N-channel MOS transistor and a fourth N-channel MOS transistor each having a grounded source;

a constant current source for outputting a constant current; and a current mirror circuit in which a ratio between an input current and an output current is constant, wherein gates of said first and third MOS transistors are connected to each other to constitute one terminal of an input terminal pair, and gates of said second and fourth MOS transistors are connected to each other to constitute the other terminal of the input terminal pair, said constant current is separated into two currents, one of which is the sum of drain currents of said third and fourth MOS transistors and the other of which is an input current of said current mirror circuit, and the sum of a drain current of said first MOS transistor and an output current of said current mirror circuit forms one of differential output currents, and the sum of a drain current of said second MOS transistor and an output current of said current mirror circuit forms the other of the differential output currents.

* * * * *